United States Patent [19]

Hiramoto et al.

[11] Patent Number: 4,477,768
[45] Date of Patent: Oct. 16, 1984

[54] LEAKAGE CURRENT DETECTING STRUCTURE

[75] Inventors: Junichi Hiramoto; Shinya Takenaka; Katsuyoshi Sunago, all of Osaka, Japan

[73] Assignee: Sumitomo Electric Industries, Ltd., Osaka, Japan

[21] Appl. No.: 350,486

[22] Filed: Feb. 19, 1982

[30] Foreign Application Priority Data

Feb. 23, 1981 [JP] Japan .................................. 56-25094

[51] Int. Cl.³ .......................................... G01R 31/02
[52] U.S. Cl. .................................................. 324/51
[58] Field of Search ...................... 361/42; 324/51, 52, 324/54, 57 R

[56] References Cited

FOREIGN PATENT DOCUMENTS 639073 12/1978 U.S.S.R. ................................ 361/42

Primary Examiner—Stanley T. Krawczewicz
Assistant Examiner—Jose M. Solis
Attorney, Agent, or Firm—Sughrue, Mion, Zinn, Macpeak & Seas

[57] ABSTRACT

A leakage current detector includes conductive inner and outer housing structures separated by an insulator, with the circuit or equipment under observation being disposed within the inner housing. A current detecting circuit connects the two housings and measures the current therebetween.

9 Claims, 3 Drawing Figures

LEAKAGE CURRENT DETECTING STRUCTURE

BACKGROUND OF THE INVENTION

This invention relates to a leakage current detecting structure which is intended to detect even small leakage currents.

FIG. 1 illustrates the operation of a conventional leakage current detector. As shown in FIG. 1, electronic equipment 1 is connected through lead wire $L_1$ and $L_2$ to a power source 2. The lead wires $L_1$ and $L_2$ are surrounded by an annular iron core 3, on which a coil 4 is wound. The coil 4 is connected to a current detecting circuit 5. Therefore, when no current $I_l$ leaks from the electronic equipment 1, a "forward" current $I_1$ in the lead wire $L_1$ is equal in value to a "return" current $I_2$ in the lead wire $L_2$, and therefore no magnetic flux is induced in the iron core 3. Specifically, the magnetic flux $\phi$ induced by the current $I_1$ and the magnetic flux $\phi$ induced by the current $I_2$ cancel each other. On the other hand, where a leakage current $I_l$ exists, the "return" current $I_2$ is smaller by the leakage current $I_l$ than the current $I_1$. Accordinglly, a magnetic flux $\phi_l$ corresponding to the difference between the current $I_1$ and the current $I_2$, namely, the leakage current $I_l$, is induced in the iron core 3. As a result, an induction current $I_3$ is induced in the coil 4 by the magnetic flux thus induced. The current detecting circuit 5 detects the induction current $I_3$ to thereby detect the magnitude of the leakage current $I_l$.

In the above-described technique, the difference between the current $I_1$ and the current $I_2$ is converted into magnetic flux, and the magnetic flux is then converted into an induction current $I_3$, with an energy loss. Accordingly, this technique cannot detect a leakage current with high accuracy; it can detect only rather large leakage currents (at least several tens of milli-amperes (mA)). Therefore, there has been a strong demand for a means capable of detecting small leakage currets, especially in the case of medical equipment, in which a small leakage current on the order of several tens of microamperes ($\mu A$) to several hundreds of micro-amperes ($\mu A$) must be detected.

SUMMARY OF THE INVENTION

In order to satisfy the aforementioned demand, an object of this invention is to provide a leakage current detecting structure which can detect even small leakage currents. The foregoing object and other objects of the invention have been achieved by the provision of a leakage current detecting device which, according to the invention, comprises: an inner housing made of an electrically conductive layer such as a metal layer, which covers an internal circuit such as electronic equipment; an outer housing made of an electrically conductive layer such as a metal layer, which is provided on an insulating layer formed on the entire outer surface of the inner housing in such a manner that the outer housing covers the outer surface of the inner housing through the insulating layer; a main insulating layer which is formed on the entire outer surface of the outer housing; and a current detecting circuit through which the inner and outer housings are electrically connected to one another, for detecting current flowing between the inner and outer housings.

DETAILED DESCRIPTION OF THE PREFERRED EMBODIMENT

Figure 1:
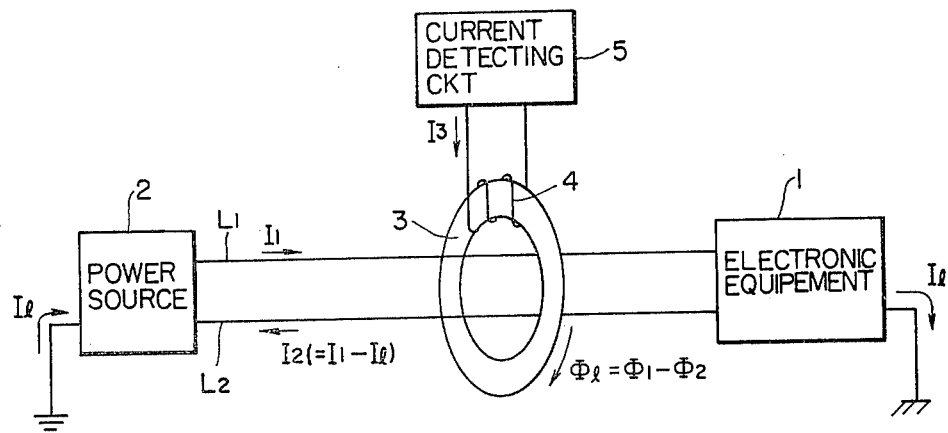
FIG. 1 is an explanatory diagram illustrating the principle of a conventional leakage current detector.
Figure 2:
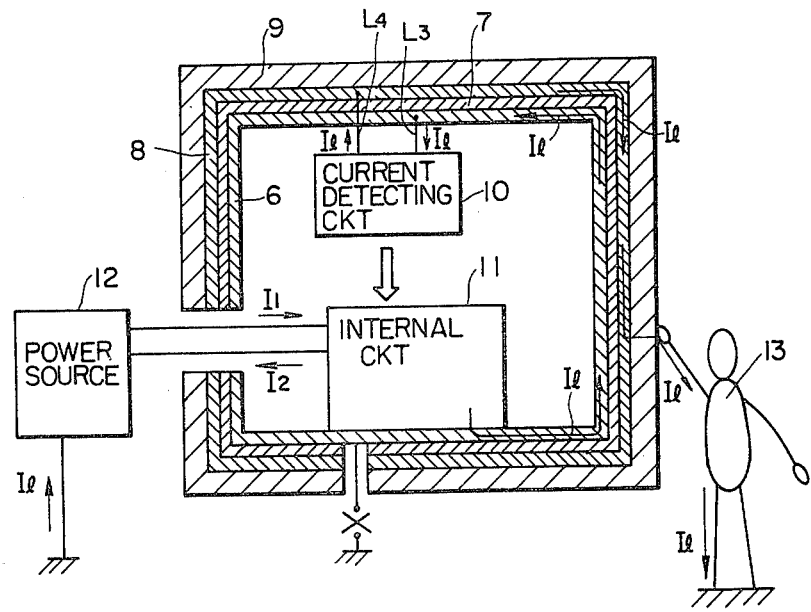
FIGS. 2 and 3 are explanatory diagrams, partially in section, depicting one embodiment of the invention.
Figure 3:
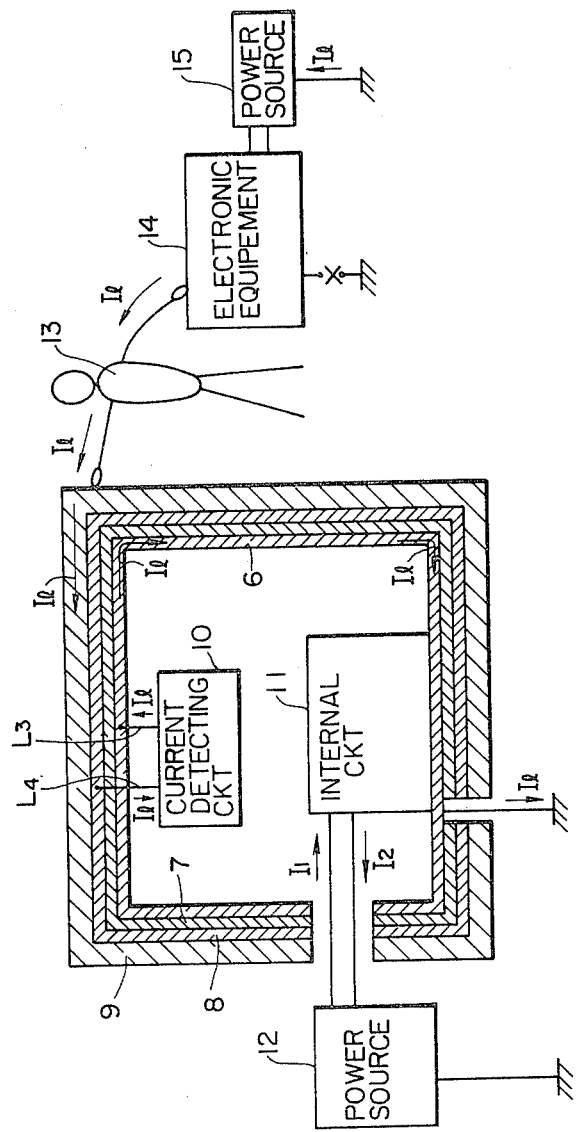

FIGS. 2 and 3 are explanatory diagrams showing one embodiment of the invention. As shown in FIGS. 2 and 3, an internal circuit 11 is surrounded by an internal housing 6 which is electrically conductive, and the outer surfaces of the internal housing 6 is covered by an insulating layer 7. An electrically conductive outer housing 8 covers the insulating layer 7 in such a manner that the inner surfaces of the outer housing 8 are in close contact with the outer surfaces of the insulating layer 7. The outer surfaces of the outer housing 8 are covered by a main insulating layer 9. A current detecting circuit 10 is provided in the internal housing 6 in such a manner that the circuit 10 is connected to the inner housing 6 through a lead wire $L_3$ and to the outer housing 8 through a lead wire $L_4$. In FIGS. 2 and 3, reference numerals 12 and 15 designate power sources; 13, a person; and 14, electronic equipment.

In the case where the inner housing 6 is not grounded as shown in FIG. 2 and a current $I_l$ leaks from the internal circuit 11, the leakage current $I_l$ flows through the inner housing 6, the lead wire $L_3$, the current detecting circuit 10, the lead wire $L_4$ and the outer housing 8 to the main insulating layer 9, and leaks to the outside from the main insulating layer 9. Therefore, the leakage current $I_l$ can be detected by the current detecting circuit 10. That is, the leakage current $I_l$ does not flow in the insulating layer 7, but rather flows along a path including the lead wire $L_3$, the current detecting circuit 10 and the lead wire $L_4$ which are low in resistance. It goes without saying that the magnitude of the leakage current $I_l$ can be reduced by increasing the insulation of the main insulating layer 9.

In the case where, as shown in FIG. 3, a current $I_l$ leaks from equipment 14 which is separately provided, and an ungrounded person 14 or the like is interposed between the electronic equipment 14 and the main insulating layer 9, even when the inner housing 6 is grounded, a current path including the grounding line is formed for the leakage current $I_l$. If, in this case, the current detecting circuit 10 is so designed that it can detect current in two directions, then the leakage current $I_l$ can be detected similarly as in the case of FIG. 2.

In the above-described embodiment, an insulating layer 7 is employed; however, the leakage current detecting structure may be modified as follows: Insulating spacers may be interposed between inner and outer housings 6 and 8 so that the same are spaced apart from each other. In this modification, the air between the inner and outer housings 6 and 8 serves as an insulating layer. Furthermore, in the case of FIG. 2, the leakage current detecting structure may be provided with an interlock mechanism which operates to suspend the supply of current to the internal circuit 11 when the current detecting circuit 10 detects a leakage current. The provision of the interlock mechanism can prevent the hazard of the leakage current causing an electric shock, especially in the case of medical equipment which is brought into contact with the human body.

In the case of FIG. 3, it is impossible to cut off the grounding line connected to the inner housing 6 which is in contact with the internal circuit 11; however, the sturcture can be modified so that, upon detection of small leakage current $I_l$, a lamp or buzzer operates to produce a warning signal. In addition, it is desirable to provide an interlock mechanism which operates to interrupt the power source 15 of the electronics 14, which may be a leakage current supply source.

As is apparent from the above description, according to the invention, the electrically conductive inner and outer housings, which covers internal circuit such as various electronic equipment, are electrically connected to each other through the current detecting circuit, so that all leakage currents flow through the current detecting circuit. Therefore, even a small leakage current can be positively detected.

What is claimed is:

1. A leakage current detecting structure comprising:
   an electrically conductive inner housing which covers an internal circuit;
   an electrically conductive outer housing provided on an insulating layer formed onthe outer surface of said inner housing in a manner such that said outer housing covers the outer surface of said inner housing through said insulating layer; and
   a current detecting circuit included within said inner housing through which said outer and inner housings are electrically connected to each other, for detecting current flowing between said inner and outer housings.

2. A leakage current detector as claimed in claim 1, further comprising a main insulating layer formed over the outer surface of said outer housing.

3. A leakage current detector as claimed in claim 1, said insulating layer covering the entire outer surface of said inner housing, and being sandwiched between said inner and outer housings.

4. A leakage current detector as claimed in claim 1, 2 or 3, said current detecitng circuit detecting current flowing in either direction therethrough.

5. A leakage current detecting structure comprising:
   an electrically conductive inner housing which covers an internal circuit;
   an electrically conductive outer housing provided on an insulating layer formed on the outer surface of said inner housing in a manner such that said outer housing covers the outer surface of said inner housing through said insulating layer;
   a current detecting circuit through which said outer and inner housings are electrically connected to each other, for detecting current flowing between said inner and outer housings; and
   interlock means for suspending current to said internal circuit when a leakage current is detected.

6. A leakage current detector as claimed in claim 5, further comprising a main insulating layer formed over the outer surface of said outer housing.

7. A leakage current detector as claimed in claim 5, said insulating layer covering the entire outer surface of said inner housing, and being sandwiched between said inner and outer housings.

8. A leakage current detector as claimed in claim 5, 6 or 7, wherein said insulating layer is predominately composed of air.

9. A leakage current detector as claimed in claim 8, said insulating layer comprising air and insulating spacer elements disposed between said inner and outer housings.

* * * * *